United States Patent
Borowy et al.

(10) Patent No.: US 9,510,436 B2
(45) Date of Patent: Nov. 29, 2016

(54) WIDE BANDGAP SEMICONDUCTOR BASED POWER SUPPLY ASSEMBLIES FOR PLASMA OPERATING SYSTEMS AND RELATED METHODS AND DEVICES

(71) Applicant: Hypertherm, Inc., Hanover, NH (US)

(72) Inventors: Dennis M. Borowy, Hanover, NH (US); Qinghua Liu, Etna, NH (US); Yu Zhang, Hanover, NH (US); Girish R. Kamath, Lebanon, NH (US); Michael Hoffa, Lebanon, NH (US)

(73) Assignee: Hypertherm, Inc., Hanover, NH (US)

( * ) Notice: Subject to any disclaimer, the term of this patent is extended or adjusted under 35 U.S.C. 154(b) by 52 days.

(21) Appl. No.: 14/675,520

(22) Filed: Mar. 31, 2015

(65) Prior Publication Data

US 2015/0282290 A1 Oct. 1, 2015

Related U.S. Application Data

(60) Provisional application No. 61/972,601, filed on Mar. 31, 2014.

(51) Int. Cl.
*B23K 10/00* (2006.01)
*H05H 1/36* (2006.01)
*H05H 1/34* (2006.01)

(52) U.S. Cl.
CPC ............... *H05H 1/36* (2013.01); *B23K 10/00* (2013.01); *B23K 10/006* (2013.01); *H05H 1/34* (2013.01); *H05H 2001/3489* (2013.01); *H05H 2001/3494* (2013.01); *Y10T 29/49002* (2015.01)

(58) Field of Classification Search
CPC .......... H05H 1/36; H05H 2001/3489; H05H 2001/3494; B23K 10/00; B23K 10/006; Y10T 29/49002

USPC ............ 219/121.39, 121.45, 121.54, 121.57, 219/121.59, 121.44
See application file for complete search history.

(56) References Cited

U.S. PATENT DOCUMENTS

| | | | |
|---|---|---|---|
| 4,839,499 A * | 6/1989 | Kotecki | B23K 9/32 219/121.39 |
| 5,601,741 A | 2/1997 | Thommes | |
| 6,002,103 A | 12/1999 | Thommes | |

(Continued)

FOREIGN PATENT DOCUMENTS

| | | |
|---|---|---|
| EP | 2071623 | 6/2009 |
| WO | 2010076909 | 7/2010 |

OTHER PUBLICATIONS

Solid-State Transformer Research and Development at North Carolina State University's FREEDM Systems Center, IEEE Power Electronics Magazine, Dec. 2014, pp. 10-11, IEEE Power Electronics Society. (2 pages).

(Continued)

*Primary Examiner* — Mark Paschall
(74) *Attorney, Agent, or Firm* — Proskauer Rose LLP

(57) ABSTRACT

In some aspects, plasma torch cutting systems can include a housing and a plasma torch power supply within the housing and configured to generate a signal that initiates generation of a plasma arc in a torch head, the power supply including an integrated circuit comprising a plurality of electronic components used to generate the signal that initiates generation of the plasma arc, at least one of the electronic components being at least partially formed of a wide bandgap semiconductor material.

34 Claims, 7 Drawing Sheets

(56) References Cited

U.S. PATENT DOCUMENTS

| | | | | |
|---|---|---|---|---|
| 6,057,524 | A * | 5/2000 | Katooka | H05H 1/48 |
| | | | | 219/121.39 |
| 6,194,682 | B1 * | 2/2001 | Schneider | B23K 10/00 |
| | | | | 219/121.48 |
| 6,365,868 | B1 | 4/2002 | Borowy et al. | |
| 7,982,159 | B2 | 7/2011 | Winn | |
| 8,637,786 | B2 | 1/2014 | Salsich et al. | |
| 9,120,182 | B2 * | 9/2015 | Bornemann | B23K 10/00 |
| 9,271,341 | B2 * | 2/2016 | Yokogawa | H05B 7/18 |
| 9,391,521 | B2 * | 7/2016 | Ichihara | H02M 3/24 |
| 2006/0191880 | A1 * | 8/2006 | Kwon | H01J 37/321 |
| | | | | 219/121.57 |
| 2008/0237201 | A1 * | 10/2008 | Shipulski | B23K 10/02 |
| | | | | 219/121.48 |
| 2009/0032502 | A1 | 2/2009 | Eickhoff et al. | |
| 2010/0078410 | A1 * | 4/2010 | Salsich | B23K 10/006 |
| | | | | 219/121.39 |
| 2011/0155703 | A1 | 6/2011 | Winn | |
| 2013/0002358 | A1 * | 1/2013 | Mitchell | G01D 3/036 |
| | | | | 330/289 |
| 2013/0240912 | A1 * | 9/2013 | Shiota | H01L 23/36 |
| | | | | 257/77 |

OTHER PUBLICATIONS

Grider et al., Advanced SiC Power Technology for High Megawatt Power Conditioning (Presentation), May 24, 2012, pp. 1-43. (43 pages).

Lidow et al., GaN: A Reliable Future in Power Conversion, IEEE Power Electronics Magazine, Mar. 3, 2015, pp. 20-26, IEEE Power Electronics Society. (7 pages).

Bindra, Wide-Bandgap-Based Power Devices: Reshaping the Power Electronics Landscape, IEEE Power Electronics Magazine, Mar. 2015, pp. 42-47, IEEE Power Electronics Society. (6 pages).

New Cree Power Module Breaks Price-Performance Barrier in Power Conversion Systems Rated up to the Megawatt Level, Web Press Release, May 15, 2014, http://www.cree.com/News-and-Events/Cree-News/Press-Releases/2014/May/1200V300A62mmpowermodule. (1 page).

Cree Introduces Industry's First 1.7-kV, All-SiC Power Module, Web Press Release, Sep. 29, 2014, http://www.cree.com/News-and-Events/Cree-News/Press-Releases/2014/September/1700V-62mm-Power-Module. (2 pages).

Cree SiC MOSFETs Help Power Japan's Growing Solar Energy Infrastructure, Web Press Release, Sep. 8, 2014, http://www.cree.com/News-and-Events/Cree-News/Press-Releases/2014/Sep./SiC-MOSFETs-Help-Japan-Solar. (2 pages).

Cree Power Modules Revolutionize Inverter Platform for Power-Generation Systems, Web Press Release, Oct. 13, 2014, http://www.cree.com/News-and-Events/Cree-News/Press-Releases/2014/October/Power-Module. (1 page).

Agarwal et al., 600 V, 1-40 A, Schottky Diodes in SiC and Their Applications, Technical Paper, available online by Mar. 30, 2015 at http://www.cree.com/~/media/Files/Cree/Power/Articles and Papers/PWRTechnicalPaper1.pdf. (9 pages).

Das, SiC Mosfet Module Replaces up to 3x Higher Current Si IGBT Modules in Voltage Source Inverter Application, Feb. 2013, pp. 22-24, available at http://www.cree.com/~/media/Files/Cree/Power/Articles and Papers/Bodos 313 Article.pdf. (3 pages).

Liu et al., Performance Evaluations of Hard-Switching Interleaved DC/DC Boost Converter with New Generation Silicon Carbide MOSFETs, Technical Paper, available online by Mar. 30, 2015 at http://www.cree.com/~/media/Files/Cree/Power/Articles and Papers/Power_Article_4.pdf. (6 pages).

Hodge, Jr., Stuart, SiC Schottky Diodes in Power Factor Correction, Power Electronics Technology, Aug. 2004, Primedia Business Magazines & Media Inc. (4 pages).

O'Neill, Silicon Carbide Diodes Make Solar Power Systems More Efficient, Technical Paper, Oct. 2008, pp. 1-4, available at http://www.cree.com/~/media/Files/Cree/Power/Articles and Papers/Sic Makes Solar Efficientsplit.pdf. (4 pages).

Cree, Application Considerations for Silicon Carbide MOSFETs, Technical Paper, pp. 1-6, available online by Mar. 30, 2015 at http://www.cree.com/~/media/Files/Cree/Power/Application Notes/CPWRAN08.pdf. (6 pages).

Cree, Design Considerations for Designing with Cree SiC Modules Part 1: Understanding the Effects of Parasitic Inductance, Technical Paper, pp. 1-20, available online by Mar. 30, 2015 at http://www.cree.com/~/media/Files/Cree/Power/Application Notes/CPWRAN12.pdf. (20 pages).

Cree, Design Considerations for Designing with Cree SiC Modules Part 2: Techniques for Minimizing Parasitic Inductance, Technical Paper, pp. 1-17, available online by Mar. 30, 2015 at http://www.cree.com/~/media/Files/Cree/Power/Application Notes/CPWRAN13.pdf. (17 pages).

Richmond, Jim, Hard-Switched Silicon IGBTs?: Cut Switching Losses in Half with Silicon Carbide Schottky Diodes, Technical Paper, pp. 1-8, available online by Mar. 30, 2015 at http://www.cree.com/~/media/Files/Cree/Power/Application Notes/CPWRANO3B.pdf. (8 pages).

Liu et al., Performance Evaluation of Cree SiC Schottky Diode in a Non-isolated LED Light Bulb Application, Technical Paper, pp. 1-12, available online by Mar. 30, 2015 at http://www.cree.com/~/media/Files/Cree/Power/Application Notes/CPWRAN11.pdf. (12 pages).

* cited by examiner

PRESENT STATE OF THE ART

ISOLATED IGNITION

PROPOSED - 1

PROPOSED - 2

WIDE BANDGAP SEMICONDUCTOR BASED POWER SUPPLY ASSEMBLIES FOR PLASMA OPERATING SYSTEMS AND RELATED METHODS AND DEVICES

RELATED APPLICATIONS

This application claims the benefit of U.S. Provisional Patent Application Ser. No. 61/972,601 filed Mar. 31, 2014, entitled "Wide Bandgap Semiconductor Based Power Supply Assembly for a Plasma Operating System," the contents of which are hereby incorporated herein by reference in their entirety.

TECHNICAL FIELD

This disclosure relates generally to thermal cutting torches (e.g., plasma arc torches), and more specifically to plasma arc torch power supplies having electronic components formed of wide bandgap semiconductor materials.

BACKGROUND

Thermal processing torches, such as plasma arc torches, are widely used in the heating, cutting, gouging, and marking of materials. A plasma arc torch generally includes an electrode, a nozzle having a central exit orifice mounted within a torch body, electrical connections, passages for cooling, and passages for arc control fluids (e.g., plasma gas). A swirl ring can be used to control fluid flow patterns in the plasma chamber formed between the electrode and the nozzle. In some torches, a retaining cap can be used to maintain the nozzle and/or swirl ring in the torch body. In operation, a plasma arc torch produces a plasma arc, which is a constricted jet of an ionized gas with high temperature and sufficient momentum to assist with removal of molten metal. Power used to operate plasma arc torches can be controlled by a power supply assembly of a plasma operating system. The power supply can include a plurality of electronic components configured to control and supply an operational current at the plasma arc torch. This plurality of electronic components can include ignition circuits, input bridges, inverters, diodes, etc. configured to transmit, modify, and regulate the signal supplied to the plasma arc torch from a power source. The proper, safe, reliable, and efficient operation of the power supply often requires hundreds to thousands of these electronic components.

SUMMARY

In some aspects, a plasma torch cutting system can include a housing and a plasma torch power supply within the housing and configured to generate a signal that initiates generation of a plasma arc in a torch head, the power supply including an integrated circuit comprising a plurality of electronic components used to generate the signal that initiates generation of the plasma arc, at least one of the electronic components being at least partially formed of a wide bandgap semiconductor material.

Embodiments can include one or more of the following features.

In some embodiments, a ratio of a level of power generated by the power supply to a weight of the power supply contained within the housing is at least 800 Watts per kilogram (W/kg). In some cases, a ratio of a level of power generated by the power supply to a weight of the power supply contained within the housing is at least 1000 Watts per kilogram (W/kg). In some cases, the weight of the power supply contained within the housing is less than 29.3 kilograms.

In some embodiments, a ratio of a level of power generated by the power supply to a volume enclosed by the housing is at least 10 Watts per cubic inch (W/in$^3$). In some embodiments, a ratio of a level of power generated by the power supply to a volume occupied by the power supply within the housing is at least 10 Watts per cubic inch (W/in$^3$).

In some embodiments, the wide bandgap semiconductor material comprises a material having a bandgap energy level that is greater than about 3 eV. In some embodiments, the wide bandgap semiconductor material comprises at least one of silicon carbide, zinc oxide, gallium nitrate, and diamond.

In some embodiments, at least one of the electronic components being at least partially formed of a wide bandgap semiconductor material are components of a torch ignition circuit of the power supply. In some embodiments, at least one of the electronic components being at least partially formed of a wide bandgap semiconductor material are configured to operate at a switching frequency of at least 50 kHz. In some embodiments, at least one of the electronic components being at least partially formed of a wide bandgap semiconductor material is configured to operate at the switching frequency of at least 50 kHz at at least 1200 volts. In some embodiments, at least one of the electronic components being at least partially formed of a wide bandgap semiconductor material is configured to operate at a switching frequency of at least 100 kHz. In some embodiments, the integrated circuit comprising the plurality of electronic components used to generate the signal that initiates generation of the plasma arc comprises at least one of a torch ignition circuit or a torch control circuit. In some embodiments, at least one of the electronic components being at least partially formed of the wide bandgap semiconductor material comprises at least one of a power supply input bridge, a power supply power factor correction diode, an inverter, a power supply output diode, and a PA insulated gate bipolar transistor. In some embodiments, at least one of the electronic components being at least partially formed of the wide bandgap semiconductor material comprises a power supply power factor correction diode that is a first silicon carbide MOSFET and an inverter that is a second silicon carbide MOSFET.

In some embodiments, at least one of the electronic components being at least partially formed of the wide bandgap semiconductor material comprises at least 25% of active electronic components used within the plasma torch cutting system being at least partially formed of the wide bandgap semiconductor material. In some embodiments, at least one of the electronic components being at least partially formed of the wide bandgap semiconductor material comprises at least 50% of active electronic components used within the plasma torch cutting system being at least partially formed of the wide bandgap semiconductor material.

In some embodiments, the plasma torch cutting system can also include a plasma torch electrically connected to the power source to produce the plasma arc.

In some aspects, a plasma arc processing system can include an enclosure body; and a plasma arc processing device power supply disposed within the enclosure body and adapted to generate a start signal that initiates generation of a plasma arc in a plasma arc processing device, the power supply including an integrated circuit comprising a plurality of electronic processing components used to generate the start signal, one or more of the electronic processing components at least partially comprising a semiconductor material having a bandgap energy level that is greater than about 3 eV.

Embodiments can include one or more of the following features.

In some embodiments, a ratio of a level of power generated by the power supply to a weight of the power supply contained within the enclosure body is at least 800 Watts per kilogram (W/kg). In some embodiments, a ratio of a level of power generated by the power supply to a volume occupied by the power supply within the enclosure body is at least 10 Watts per cubic inch (W/in$^3$).

In some embodiments, the semiconductor material having a bandgap energy level that is greater than about 3 eV includes a wide bandgap material. In some embodiments, the semiconductor material having a bandgap energy level that is greater than about 3 eV comprises at least one of silicon carbide, zinc oxide, gallium nitrate, and diamond. In some embodiments, one or more of the electronic processing components at least partially comprising the semiconductor material having a bandgap energy level that is greater than about 3 eV are components of a torch ignition circuit of the power supply. In some embodiments, the one or more of the electronic processing components at least partially comprising the semiconductor material having a bandgap energy level that is greater than about 3 eV are configured to operate at a switching frequency of at least 50 kHz. In some embodiments, the one or more of the electronic processing components at least partially comprising the semiconductor material having a bandgap energy level that is greater than about 3 eV are configured to operate at the switching frequency of at least 50 kHz at at least 1200 volts.

In some embodiments, the integrated circuit comprising the plurality of electronic components used to generate the start signal comprises a torch ignition circuit.

In some embodiments, at least 50% of active electronic components used within the plasma torch cutting system are at least partially formed of the semiconductor material having a bandgap energy level that is greater than about 3 eV.

In some embodiments, the one or more of the electronic processing components at least partially comprising the semiconductor material having a bandgap energy level that is greater than about 3 eV comprises at least one of a power supply input bridge, a power supply power factor correction diode, an inverter, a power supply output diode, and a pilot arc insulated gate bipolar transistor.

In some embodiments, the plasma arc processing system also includes a plasma torch electrically connected to the power source to produce the plasma arc.

In some aspects, a plasma torch cutting system can include a housing; a plasma arc torch; and a power supply within the housing and electrically connected to the plasma arc torch, the power supply configured to generate an electric signal that initiates generation of a plasma arc in the plasma arc torch, where the power supply includes an input circuit having at least one of i) a rectification circuit and ii) a power factor corrected boost converter circuit; and an output circuit having at least one of i) an inverter circuit and ii) one or more output diodes, wherein the input circuit and the output circuit are formed of a plurality of active electronic components used to generate the electric signal, and at least 25% of the active electronic components are formed, at least in part, of a wide bandgap semiconductor material.

Embodiments can include one or more of the following features.

In some embodiments, the wide bandgap semiconductor material comprises a material having a bandgap energy level that is greater than about 3 eV. In some embodiments, the wide bandgap semiconductor material comprises silicon carbide. In some embodiments, at least 50% of the active electronic components are formed at least in part of a wide bandgap semiconductor material. In some embodiments, the at least 25% of the active electronic components are formed, at least in part, of a plurality of wide bandgap semiconductor materials.

In some aspects, a method of manufacturing a plasma torch cutting system can include providing a plasma torch power supply disposed within the housing and configured to generate a signal that initiates generation of a plasma arc in a torch head, the power supply including an integrated circuit comprising a plurality of electronic components used to generate the signal that initiates generation of the plasma arc, at least one of the electronic components being at least partially formed of a wide bandgap semiconductor material; disposing the plasma torch power supply within a power supply housing and securing the plasma torch power supply to the power supply housing; and providing one or more gas flow connections within the housing configured to be to connected to a plasma torch lead line to provide gas flow to the torch head.

The systems and methods described herein can include one or more electronic components formed at least in part of any of the wide bandgap materials described herein. The wide bandgap materials can be implemented in any of various different configurations and combinations of wide bandgap materials used throughout the power supply's electronic component modules. As discussed herein, as a result of the electronic components formed of wide bandgap materials, the power supplies used to power plasma arc torches can have improved performance (e.g., increased switching speeds, improved voltage handling capabilities, etc.) and topology (e.g., simplified manufacturing, compound components, etc.), and can be designed and manufactured to be smaller, and lighter (and more convenient to use and transport) than conventional systems while increasing reliability and performance. The term wide bandgap (WBG) material, as used herein, is intended to describe any of various materials that are configured to permit electronic devices (e.g., active electronic devices described herein) to operate at higher voltages, frequencies, and temperatures than conventional semiconductor materials. "Wide bandgap" typically refers to higher voltage electronic band gaps (e.g., the energy gap between the top of the valence band and the bottom of the conduction band) significantly larger than one electronvolt (eV). The exact threshold of "wideness" as used with wide bandgap materials depends on the context and particular applications, but for some typical usages described herein, "wide" bandgap can refer to material with a bandgap energy level of at least three (3.0) eV. Generally, wide bandgap materials have bandgap energy level greater than that of the commonly used conventional semiconductors materials such as silicon (with a bandgap energy level of about 1.1 eV) or gallium arsenide (with a bandgap energy level of about 1.4 eV). In some embodiments, as discussed below, wide bandgap semiconductor materials can be implemented in mechanized plasma torch systems specifically in ignition circuits (in some embodiments only in ignition circuits) due to the use of lower voltage rated semiconductor devices (e.g. 600V) in realizing the power train of the mechanized plasma power supply. At this lower voltage, some wide band gap material (e.g., silicon carbide based) semiconductor devices, in some cases, may not exhibit marked performance improvements (e.g., efficiency improvements and ability to operate at higher frequencies) at all locations throughout the power supply when compared to some other wide band gap material (e.g., gallium nitrate based) semiconductor devices. Whereas, in some embodiments, wide bandgap materials may be implemented in light industrial plasma torch systems that operate at comparatively higher voltages (e.g., ~1200 volts) where the benefits of some specific wide bandgap materials (e.g., silicon carbide) may be more apparent.

Examples of such wide bandgap materials can include, but are not limited to, silicon carbide, zinc oxide, gallium nitrate, and diamond. Table 1 below shows example properties for silicon carbide, zinc oxide, gallium nitrate, and diamond.

TABLE 1

| Material | Symbol | Bandgap Energy |
|---|---|---|
| Silicon Carbide | SiC | 3.3 (eV) |
| Zinc Oxide | ZnO | 3.4 (eV) |
| Gallium Nitrate | GaN | 3.4 (eV) |
| Diamond | C | 5.5 (eV) |

When designing a power supply assembly, which includes one or more semiconductor materials, the design goal is typically to increase performance speed, operation frequency, and user options while reducing system weight, cost, and component requirements, thereby allowing the power supply assembly to be smaller, faster, and lighter. Particularly, for portable plasma operating systems (e.g., manual plasma cutting systems), compactness and portability of the power supply and the overall system are typically critical design goals. In today's market, conventional plasma power supply assemblies include electronic components formed of silicon semiconductor materials (i.e., materials with a bandgap energy level of less than about 1.5 eV), which have several thermal and electrical limitations that constrain design choices.

Embodiments described herein can have one or more of the following advantages.

The power supply systems described herein having electronic components formed of wide bandgap semiconductor materials can be designed and manufactured to be smaller, lighter, and more energy efficient than some other conventional power supplies made with conventional electronic components formed of conventional semiconductor materials, such as materials with a bandgap energy level of less than about 1.5 eV (e.g., conventional silicon). For example, electronic components, such as transistors and diodes, formed of wide bandgap materials can be operated at higher voltages while maintaining lower temperatures than conventional components, which enables manufacturing the components in smaller and more compact packages. Additionally, electronic components formed of wide bandgap materials can operate at higher (e.g., faster) switching frequencies than some components formed of conventional semiconductors. Based in part on the increased switching frequencies, additional components within certain types of components, such as magnets or heat sinks, can also be manufactured smaller (or in some cases omitted).

Additionally or alternatively, the systems and methods described herein can be used to reduce the size or mass of certain circuits within a plasma torch system. For example, as described below, plasma torch systems can include circuits having one or more solid state switching devices that can be used to increase switching speeds and/or the voltage accommodated by the circuit. In some cases, the addition and implementation of these solid state switching devices can reduce the size and/or mass of some of the passive electronic components included within the circuit. For example, as discussed below, the addition of the solid state switching device can reduce the size of capacitors and inductors used within a plasma torch ignition circuit and/or switch. In some embodiments, solid state switching devices can also be formed of one or more wide bandgap semiconductor materials. As detailed herein, incorporation of such wide bandgap semiconductor materials can help to enable design and manufacturing of smaller more compact electronic components and more efficient circuits in which they are implemented. In addition, the wide bandgap semiconductor materials can help to reduce the number of other components required within the circuit or the size of some of the components within the circuit. For example, the addition of one or more solid state switching devices within a plasma torch ignition circuit can enable using passive electronic devices (e.g., inductors or capacitors) that are smaller (e.g., lighter or smaller in volume) than would otherwise be needed without such solid state switching devices. In some cases, some of the passive components can be removed from the system. Therefore, the plasma torch ignition circuit module can be smaller and more compact than conventional torch ignition circuits. As a result, the plasma torch ignition circuit can be disposed in a variety of locations in which conventional ignition circuits could not be arranged due in part to size constraints. For example, using the ignition circuits described herein having solid state switching devices and more compact passive electronic components, the torch ignition circuit can be disposed comparatively closer to a plasma torch than some conventional ignition circuits, reducing signal noise (EM noise) and improving customer experience.

As a result of the smaller and more compact electronic components that can operate more efficiently, plasma arc system power supplies described herein can be designed and manufactured with improved reliability and performance while also being smaller and lighter than some other conventional systems that produce an equivalent amount of power. The smaller and lighter power supplies can result in systems that are easier and more convenient for a user.

DETAILED DESCRIPTION

In some aspects, as discussed herein, the systems and methods described herein can include one or more electronic components formed at least in part of any of the wide bandgap materials described herein. The wide bandgap materials can be implemented in any of various different configurations and combinations of wide bandgap materials used throughout the power supply's electronic component modules (e.g., power devices). As a result of the electronic components formed of wide bandgap materials, the power supplies used to power plasma arc torches can be designed and manufactured to be more robust and efficient, as well as smaller and lighter (and more convenient to use and transport) than conventional systems.

Figure 1:
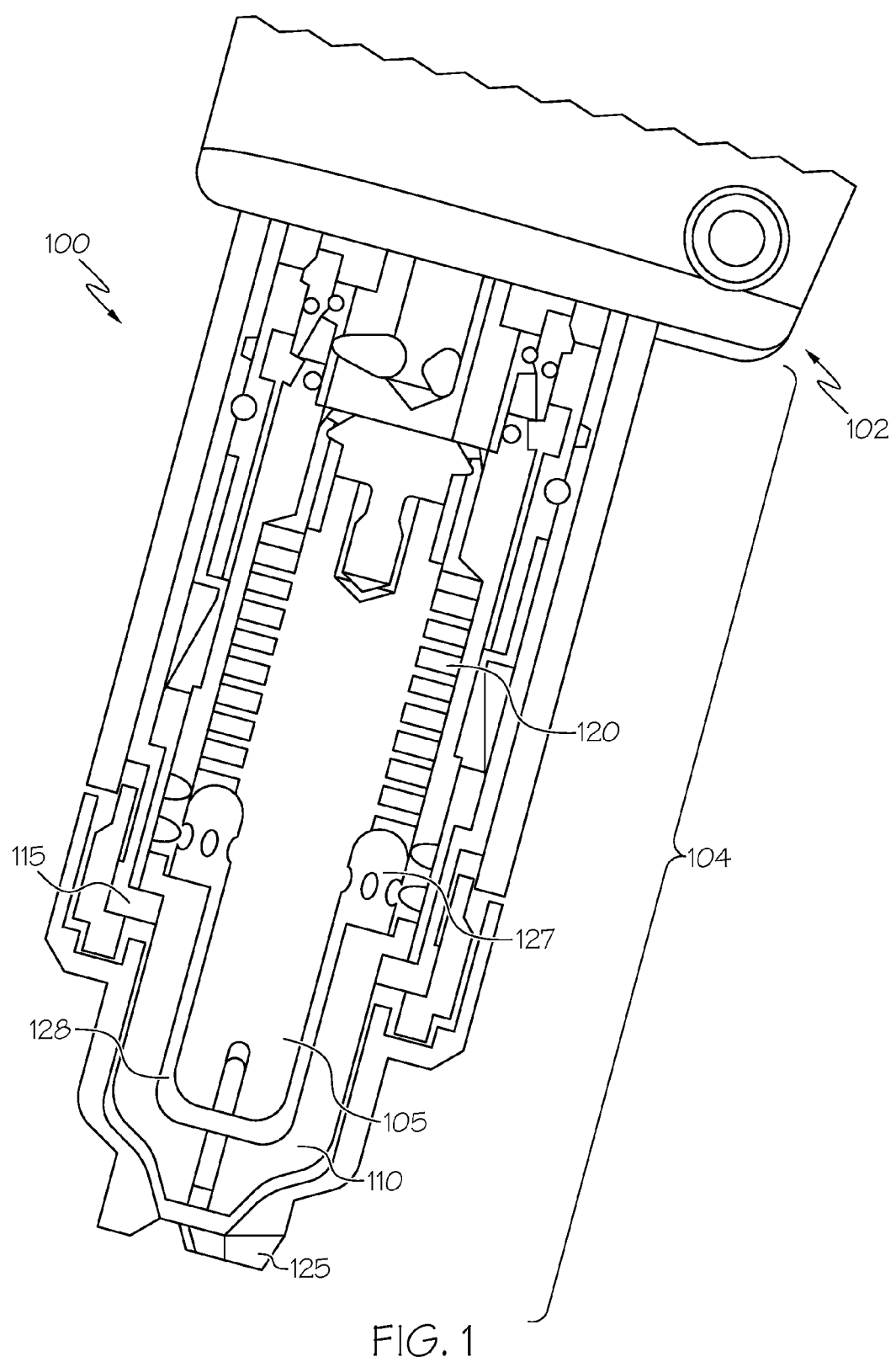
FIG. 1 is a cross-sectional view of an example plasma arc torch.

Referring to FIG. 1, an example plasma arc torch 100 can include a torch body 102 and a torch tip 104. The torch tip 104 includes multiple consumables, for example, an electrode 105, a nozzle 110, a retaining cap 115, a swirl ring 120, and a shield 125. The torch body 102, which has a generally cylindrical shape, supports the electrode 105 and the nozzle 110. The nozzle 110 is spaced from the electrode 105 and has a central exit orifice mounted within the torch body 102. The swirl ring 120 is mounted to the torch body 102 and has a set of radially offset or canted gas distribution holes 127 that impart a tangential velocity component to the plasma gas flow, causing the plasma gas flow to swirl. The shield 125, which also includes an exit orifice, is connected (e.g., threaded) to the retaining cap 115. The retaining cap 115 as shown is an inner retaining cap securely connected (e.g., threaded) to the nozzle 110. In some embodiments, an outer retaining cap (not shown) is secured relative to the shield 125. The torch 100 can additionally include electrical connections, passages for cooling, passages for arc control fluids (e.g., plasma gas), and a power supply. In some embodiments, the consumables include a welding tip, which is a nozzle for passing an ignited welding gas. In some examples, the torch can include a switch (e.g., a trigger switch) that can be used to send a signal to the power supply to initiate generation of a plasma arc by the power supply. Based on this signal, the electric components within the power supply may generate and modulate the signal provided to the torch to control ignition and cutting operations.

In operation, plasma gas flows through a gas inlet tube (not shown) and the gas distribution holes 127 in the swirl ring 120. From there, the plasma gas flows into a plasma chamber 128 and out of the torch 100 through the exit orifice of the nozzle 110 and the shield 125. A pilot arc is first generated between the electrode 105 and the nozzle 110. The pilot arc ionizes the gas passing through the nozzle exit orifice and the shield exit orifice. The arc then transfers from the nozzle 110 to a workpiece (not shown) for thermally processing (e.g., cutting or welding) the workpiece. It is noted that the illustrated details of the torch 100, including the arrangement of the components, the direction of gas and cooling fluid flows, and the electrical connections, can take a variety of forms. In some embodiments, the plasma arc torch 100 is air cooled. Air-cooled torches can be simpler to use and better suited for certain applications, such as low-amp plasma cutting applications or applications where accessibility and/or system portability are required, in comparison to water-cooled torches. The plasma torch 100 depicted in FIG. 1 can be used as part of a plasma processing system that includes a power supply as discussed herein that includes one or more electronic components made from the wide bandgap semiconductor materials described herein. The use of these wide bandgap based electronic components to convert, control, and convey the torch signals increases system switching frequency and improves portability, circuit configuration and system architecture, efficiency, and performance. Similarly, electronic components used within the plasma torch 100 can be manufactured smaller and lighter, which can result in a plasma torch that is easier for a user to use (e.g., based on portability).

Figure 2A:
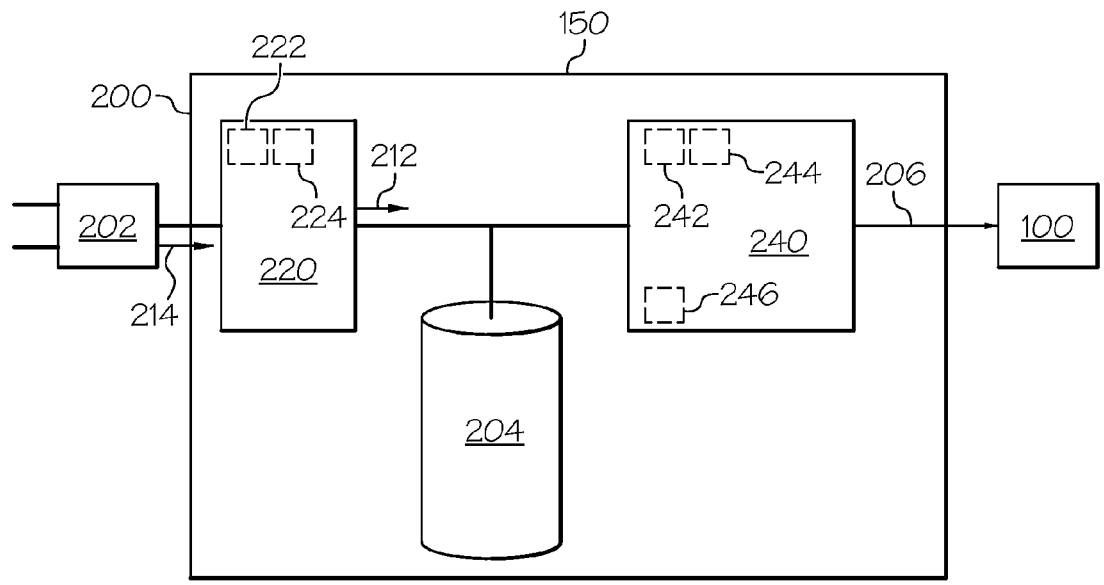
FIG. 2A is a block diagram of an example plasma arc torch power supply with an energy storage device illustrating one or more electronic components formed in part of a wide bandgap semiconductor material.

FIG. 2A shows an exemplary power supply assembly 200 configured to provide energy to a plasma arc torch, such as the plasma arc torch 100 of FIG. 1, to sustain a plasma arc during a desired torch operation. As shown, the power supply assembly 200 can include a housing 150 that serves as an enclosure for the various electrical and fluidic components of the power supply. For example, the components within the housing 150 can include an input circuit 220, an energy storage device 204 (e.g., a capacitor, a battery, a fuel cell, etc.), an output circuit 240, and a torch connector 206. The input circuit 220 of the power supply assembly 200 is connected to an external power source 202, which can provide an alternating-current (AC) input signal 214 to the input circuit 220. The energy storage device 204 can be connected between an output of the input circuit 220 and an input of the output circuit 240. The torch connector 206 can be located between an output of the output circuit 240 and the plasma arc torch 100.

Figure 2B:
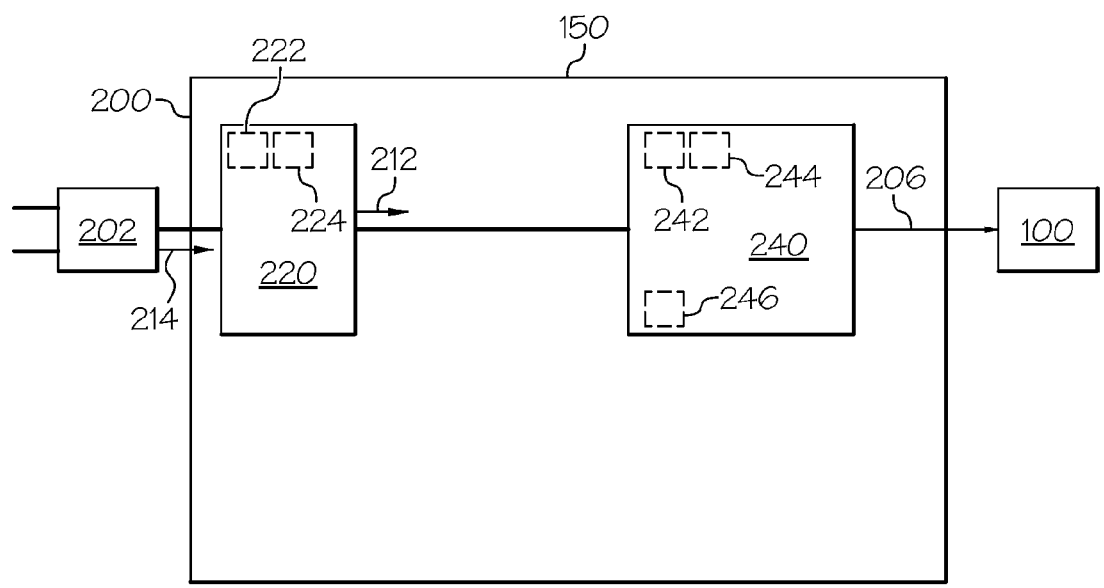
FIG. 2B is a block diagram of an example plasma arc torch power supply without an energy storage device illustrating one or more electronic components formed in part of a wide bandgap semiconductor material.

The energy storage device 204 of the power supply assembly 200 can comprise one or more removable and/or rechargeable battery cells used to replace or supplement the power supplied by the external power supply 202. The energy storage device 204 is optional. For example, referring to FIG. 2B in some embodiments, the power supply 202 does not include an energy storage device 204. Hence, the plasma arc torch is powered by the external power source 202. The other components of FIG. 2B can be similar to or the same as the components of FIG. 2A.

Referring back to FIG. 2A (and FIG. 2B), the input circuit 220 can include at least one of a rectification circuit module 222 or a boost circuit module 224. The rectification circuit 222 can include a diode bridge to rectify the input signal 214 received from the external power source 202. The boost circuit 224 can be a power factor corrected (PFC) boost converter that converts the rectified signal from the rectification circuit 222 or the input signal 214 from the external power source 202 to a substantially constant, predefined direct-current (DC) output signal 212. While the voltage of the input signal 214 can vary based on the magnitude of the external power supply 202, the voltage of the output signal 212 can be maintained by the input circuit 220 to be substantially constant, such as within about a 20% deviation from a nominal voltage ($V_{bus\_nominal}$) that is desired for operating the plasma arc torch 100.

The output circuit 240 and the torch connector 206 of the power supply assembly 200 can provide the output signal 212 from the input circuit 220 to the plasma arc torch 100.

The torch connector (e.g., a plasma torch lead line) 206 can be a transmission medium that includes an electrical transmission capability and is connected to the plasma arc torch 100. The electrical transmission capability can include an electrical lead set, a bus, and/or a wired connection.

The output circuit 240 can include an inverter circuit module 242 configured to modify a signal, such as from a DC waveform to an AC waveform, prior to providing the resulting modified signal to the torch connector 206. In some embodiments, the output circuit 240 can include one or more output diodes (e.g., in the form of an output diode module) 244 that are configured to rectify an AC waveform from the inverter circuit 242, thereby transforming the waveform to a DC waveform prior to providing the resulting modified signal to the torch connector 206.

In some embodiments, the output circuit 240 can include a pilot arc switching device (e.g., a MosFET (e.g., an SiC MosFET) or insulated-gate bipolar transistor module (PA IGBT)) 246, which is an electronic component that can be used to start a plasma arc torch. For example, switching devices can be used to control the pilot current to the torch for ignition. When a user first pulls an ignition switch (e.g., a trigger), the pilot energy is on and in, an LSI system, current flows. Supply air is then provided, which forms an arc (e.g., the pilot arc) in the air. Without such a switching device, a high frequency starting system would typically be required. When the current is transferred to the workpiece (e.g., a metal plate), the switching device is turned off and all the current can flow to the workpiece.

Power supplies can include any number of components formed of wide bandgap semiconductor materials in various configurations based on the technical requirements of the power supply. For example, in some embodiments, a certain percentage of the electronic components used in the power supply 200, such as active electronic components modules in FIG. 2, can be formed of wide bandgap semiconductor materials. For example, as detailed below, at least 10% (e.g., at least 25%, at least 50%, at least 75%, at least 90%, or 100%) of active electronic component modules used within the plasma torch cutting system can include or be partially formed of wide bandgap semiconductor materials.

As described herein and detailed below, such wide bandgap semiconductor materials can be implemented in order to design and manufacture a plasma torch power supply assembly having more compact and efficient electronic components. Use of such compact electronic components (e.g., wide bandgap based electronic components) can result in a power supply assembly that can be smaller, lighter, and more convenient to transport (e.g., carry) and use. This power supply having reduced magnetics and heat sink requirements in part due to the increased switching frequency and circuit configurations of the compact system.

Figure 3:
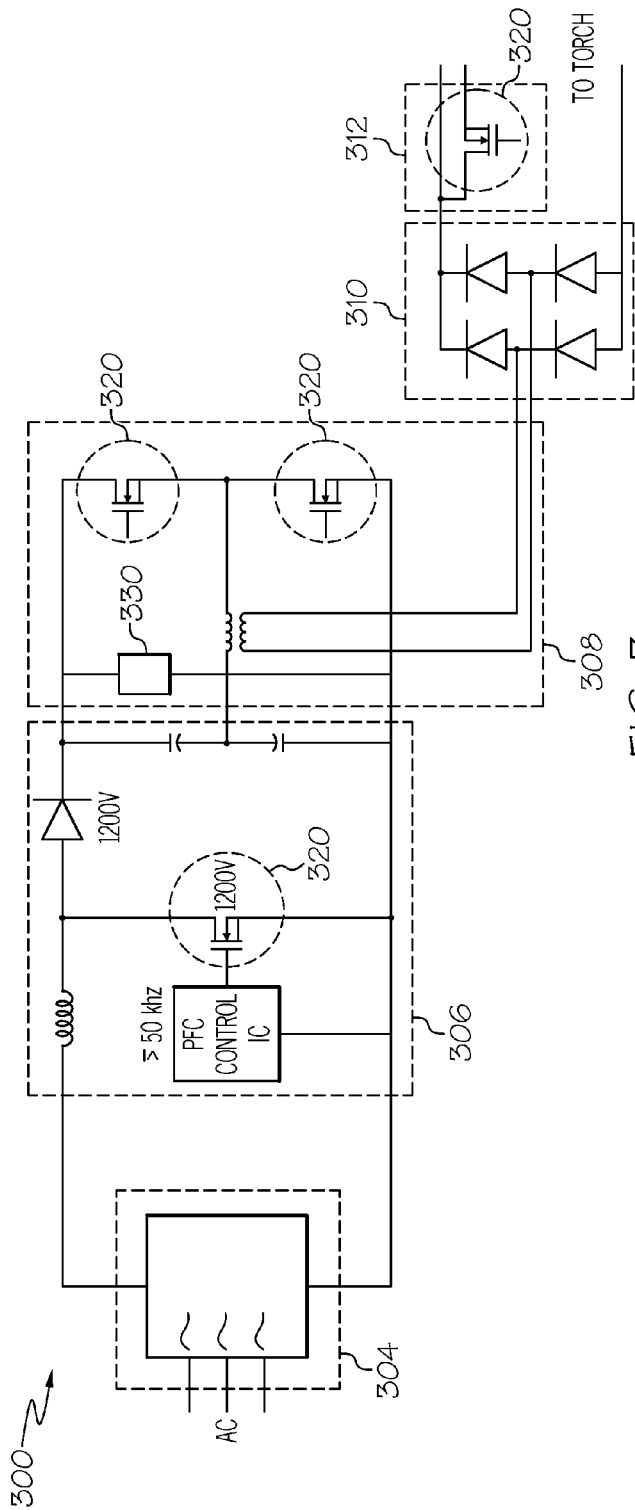
FIG. 3 is a schematic diagram of an example plasma arc torch power supply illustrating one or more electronic components formed in part of a wide bandgap semiconductor material.

FIG. 3 illustrates a design schematic of an example plasma torch power supply that can receive AC power from an external power source and provide desired power to the plasma torch. For example, a power supply 300 can include at least an input bridge 304, a power factor corrected boost module 306, an inverter module 308, an output diode module 310, and a pilot arc insulated-gate bipolar transistor module 312. The respective components illustrated in the schematic of FIG. 3 can serve similar functions (or the same functions) as those described above with respect to the diagram of FIGS. 2A and 2B.

The power supply 300 can include any number of components including wide bandgap semiconductor materials in any number of possible configurations. For example, as discussed below, at least 10% (e.g., at least 25%, at least 50%, at least 75%, at least 90%, or 100%) of active electronic devices used within the plasma torch cutting system can include one or more wide bandgap semiconductor materials.

Figure 8A:
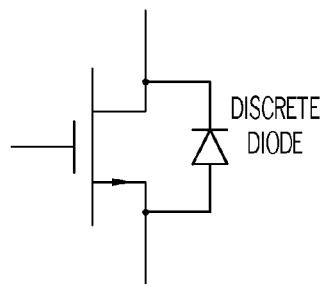
FIG. 8A is an example schematic diagram of a switching device with a discrete diode.

In part as a result of the circuit design illustrated in FIG. 3, electronic components made from the one or more wide bandgap semiconductor materials can be used to power the power supply and generate a plasma arc in the plasma arc torch. Use of such wide bandgap semiconductor materials can allow for, as detailed below, creation of a smaller, lighter, more compact and energy efficient power supply than those of conventional systems having an equivalent power output. For example, the power supply 300 can include switching devices (e.g., MosFETs, IGBTs, etc.) and/or transistor components 320 disposed in one or more of the various modules. In some embodiments, the transistor components can be traditional IGBT's, as illustrated in FIG. 8A. As discussed herein, using traditional IGBT's can require implementation of additional IGBTs (e.g., in some cases 4 IGBT's connected in parallel). Also, the traditional IGBT's may require a discrete diode, which is an additional component that is attached/connected at some point in the manufacturing process. In some embodiments, traditional IGBTs are replaced by a wide bandgap switching device (e.g., MosFET (e.g., SiC)), as illustrated in FIG. 8B.

Figure 8B:
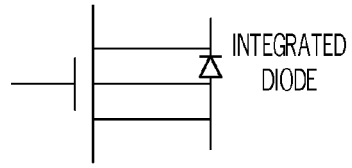
FIG. 8B is an example schematic diagram of a switching device with an integrated diode.

In some embodiments, one or more of the transistor modules 320 can be a switching device (e.g., a MosFET, an IGBT, etc.) made from a wide bandgap semiconductor material, which may be created in a simplified manner with an integrated diode, as illustrated in FIG. 8B. For example, as illustrated in FIG. 8B, switches made from wide bandgap semiconductor materials can have the capability to perform the required switching functions without the addition of another part/component (i.e., the discrete diode of FIG. 8A). FIG. 8B illustrates an integrated diode that can be manufactured as a component of the switching assembly, resulting in a device that is easier to design and manufacture.

Figure 9:
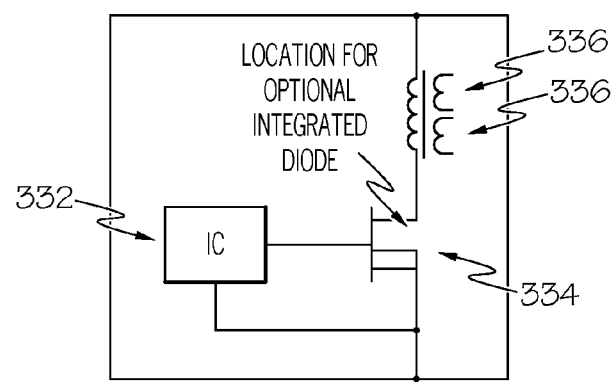
FIG. 9 is an example schematic diagram of a flyback/auxiliary power supply circuit with a SiC switching device.

Additionally, in some embodiments, the power supply 300 can also include a flyback/auxiliary power supply (e.g., flyback power supply) 330. The flyback power supply 330 can be connected in the circuit to provide additional power to one or more other components within the power supply. Examples of conventional flyback power supply circuits are described in U.S. Pat. No. 6,365,868 by Borowy et al., the contents of which are hereby incorporated herein by reference in their entirety. Briefly referring to FIG. 9, the flyback power supply 330 as discussed herein can include at least a control integrated circuit (e.g., a pulse width modulation integrated circuit) 332 and a transistor switching device 334. For example, the switching device 334 can include a silicon carbide (SiC) MOSFET (e.g., a 1500V or 1700V SiC MOSFET devices). In some embodiments, the switching device 334 can include an integrated diode (shown as optional in FIG. 9). The flyback power supply 300 can also include or connect to an inductance device (e.g., a magnetic device or windings for an inductor) 336.

The wide bandgap materials can be implemented in any of various different configurations and combinations of wide bandgap materials used throughout the power supply's electronic component modules.

For example, in some embodiments, a certain percentage of the electronic components used in the power supply, such as active electronic components (e.g., transistors, diodes, or other types of switches), can be formed of wide bandgap semiconductor materials. For example, at least 10% (e.g., at least 25%, at least 50%, at least 75%, at least 90%, or 100%) of active electronic components used within the plasma torch cutting system can include or be partially formed of wide bandgap semiconductor materials.

In some embodiments, by way of an example, as shown in the first row of Table 2 below, rather than conventional silicon semiconductor materials, some of the components of the power supply assembly 200 can be made from wide bandgap semiconductor materials. For example, the PFC boost converter (e.g., boost circuit module 224 or boost module 306) can be made from (i) silicon carbide (SiC) metal-oxide-semiconductor field-effect transistors (MOSFET) and/or (ii) SiC PFC diodes, both of which are constructed from wide bandgap semiconductor materials. The inverter (e.g., inverter circuit module 242 or inverter module 308) can be made from one or more SiC MOSFETs. In such embodiments, the input bridge (e.g., input bridge 304), output diodes (e.g., output diode module 310) or the switching device (e.g., switching device (e.g., MosFET or PA IGBT) 312) could still be silicon-based (i.e., a non-wide bandgap silicon material). Hence, in some embodiments, the power supply assembly 200 can be made from a combination of electronic component modules formed of conventional silicon semiconductor materials and wide bandgap semiconductor materials.

In some embodiments, as shown in the second row of Table 2, most or all of the semiconductor-based power supply components, including the diode bridge (e.g., input bridge 304), the PFC boost converter (e.g., boost circuit module 224 or boost module 306), the inverter (e.g., inverter circuit module 242 or inverter module 308), the output diodes (e.g., output diode module 310), and the switching device (e.g., switching device 312), can be made from wide bandgap semiconductor materials.

TABLE 2

| Wide Bandgap Material Implementation by Power Supply Device | | | | | |
|---|---|---|---|---|---|
| | Input Bridge | PFC | INVERTER | OUTPUT DIODES | PA IGBT |
| WBG Example 1 | Si Diodes | SiC MOSFET (WBG) SiC PFC diode (WBG) | SiC MOSFET (WBG) | Si Diodes | Si IGBT with Si APD |
| WBG Example 2 | WBG | WBG | WBG | WBG | WBG |

In some embodiments, a power supply assembly used for a 45 A plasma arc torch can incorporate a PFC boost converter made from one or more diodes made from a wide bandgap material (e.g., SiC diodes). In some embodiments, a power supply assembly used for a 65 A or 85 A plasma arc torch can use one or more SiC MOSFETs and/or SiC diodes for a PFC boost converter (e.g., the boost converter 224 or 306) and SiC MOSFETs for an inverter (e.g., the inverter 242 or 308) (e.g., a half-bridge device).

It can be advantageous to use wide bandgap devices in a plasma power supply assembly in place of one or more silicon-based devices. As discussed herein, the benefits can include reduction in power loss, higher frequency operation, higher efficiency, fewer components in the power supply (e.g., anti-parallel diodes (ADP) are typically no longer needed for a SiC MOSFET (as opposed to a Si IGBT)), weight reduction, higher power-to-weight ratio and system volume reduction (e.g., increased compactness).

Table 3 shows a performance comparison between using conventional Si IGBT to construct power switches in a half-bridge inverter and using a wide bandgap material, such as SiC MOSFET in the same inverter for a PMX85 plasma arc torch manufactured by Hypertherm Inc. Some conventional plasma arc torch power supplies (e.g., for the PMX85) can include electronic components that are formed of conventional semiconductor materials (typically silicon semiconductor materials). For example, in a conventional system, a diode bridge of an input circuit could be made from silicon diodes which may be discretely attached to the bridge as opposed to diodes made from wide bandgap semiconductor materials which may be integrated with other components/circuits. A PFC boost converter of an input circuit could be made from (i) silicon insulated-gate bipolar transistors (Si IGBT) with silicon anti-parallel diodes (Si APD) and/or (ii) silicon PFC diodes. An inverter of an output circuit could be made from Si IGBT with Si APD. Output diodes can be made from silicon diodes which may also be discretely attached to other components/circuitry as opposed to diodes made from wide bandgap semiconductor materials which may be integrated with other components/circuits. A pilot arc (PA) IGBT, which is a device that can be used to start a plasma arc torch, could be made from Si IGBT with Si APD. The PA IGBT can have a collector located between an inverter current feedback sensor and transfer sensor and an emitter connected to the nozzle of the torch.

In some embodiments, silicon carbide based electrical components may be used for high voltage applications (e.g., about 1200V) proximate a torch, at a torch ignition circuit, or within a high voltage power supply. In some embodiments, gallium nitrate based electrical components may be used for lower voltage applications (e.g., about 600V) within some power supplies.

The PMX85 plasma arc torch includes 1200v rated components. Data for the existing/standard Si IGBT is based on device FF150R12KS4 manufactured by Infineon Technologies. Data for a SiC MOSFET is based on device CCS050M12CM2 manufactured by Cree Inc., where two 50a/1200v SiC MOSFET dies are connected in parallel inside of the inverter module. The following metrics are compared: switch current (Isw), voltage between collector and emitter (Vce), energy lost to power switching when switched off (Eoff), switching frequency (Freq), conduction loss (Pc), switching power (Psw), total power (Ptotal), thermal resistance junction to case (Rth-jc) and temperature swing (of device) junction to case (Delta Tj).

The Delta Tj describes the temperature increase within the device during a typical cutting cycle. Generally, the higher the Delta Tj, the more the device will erode (e.g., break down due to heat) over a period of cutting cycles. That is, the higher the Delta Tj, the lower the usable life length of the device. As depicted in Table 3 below, the FF150R12KS4 150a/1200v device can switch at 27 khz with a Delta Tj of 22° C., whereas the 100a/1200v SiC MOSFET device can also switch at 27 khz with a Delta Tj of 13° C. Therefore, the 100a/1200v SiC MOSFET device heats up less the FF150R12KS4 150a/1200v device and as a result, is expected to last longer. Alternatively, the 100a/1200v SiC MOSFET device can switch at a higher frequency (72 khz) (resulting in a faster switching speed) and have the same Delta Tj of 22° C. (e.g., and is therefore expected to have a similar usable life length while having higher performance).

TABLE 3

| Device | Isw (a) | Vce (v) | Eoff (mj) | Freq (khz) | Pc (w) | Psw (w) | Ptotal (w) | Rth-jc (C/w) | Delta Tj (° C.) | Comments |
|---|---|---|---|---|---|---|---|---|---|---|
| FF150R12KS4 150a/1200v | 66 | 2.7 | 5.1 | 27 | 82 | 138 | 220 | 0.10 | 22 | Fastest 1200v IGBT available used in PMX85 CSA unit at 27 khz |
| 100a/1200v SiC MOSFET | 66 | 1.24 | 1.0 | 27 | 38 | 27 | 65 | 0.20 | 13 | Much lower power loss, lower junction temp at same frequency |
|  | 66 | 1.24 | 1.0 | 72 | 38 | 72 | 110 | 0.20 | 22 | Keeping Delta Tj the same, can increase frequency by X2.67 |
|  | 66 | 1.24 | 1.0 | 182 | 38 | 182 | 220 | 0.20 | 44 | Keeping losses the same, can increase frequency by X6.74 |

Below is a set of sample calculations of the various performance metrics in Table 3 for one of the power switches in the half-bridge inverter of Table 3:

Isw (switch current)=85*7/9(xfr turns ratio)=66a

Vce from datasheet

Eoff from datasheet adjusted to 760v Bus voltage;

Eoff=per die at 33a=0.5 mj, thus 1.0 mj for both in parallel.

Pc (conduction loss)=Isw*Vce*0.46 (0.46 is Power device On duty)

Psw=Eoff*Freq

Junction temperature (Tj) approx. 125 C

Resistance Drain to Source (Rds) of 125 C typ=1.5*(25 m/2)=18.8 mohm Vce=66*18.8 m=1.24v As shown in Table 3, design frequency can increase by about 2.67 times when wide bandgap semiconductor materials are used (as described above for the comparison above for the 100a/1200v SiC MOSFET device operating at 72 khz and the FF150R12KS4 150a/1200v device operating at 27 khz), which can allow the use of smaller magnetic components and smaller heat sink devices. Through experimentation and testing it has been found that as the switching frequency increases the size and weight of the power supply system decreases at a predictable rate. This rate of decrease has been found to be approximately equal to 1/(Square Root of((New Switching Frequency)/(Existing Switching Frequency))). Thus, with the above identified and discussed implementation of wide band gap devices and associated circuit design and reconfiguration, the overall weight and size of the power supply assembly can be reduced by approximately 1/(SQR (2.67))=1/1.63=0.59. In addition, as wide bandgap semiconductor materials evolve and improve in performance, these benefits are expected to further improve. Furthermore, as power device packaging evolves (e.g., improved die mounting, improved thermal resistance, better die attachment inside of modules, etc.), wide bandgap semiconductor materials can have higher Tj and delta Tj capability. Thus, operating frequency can continue to increase by 6-10 fold.

As discussed above, the systems and methods described herein, in some embodiments, can provide plasma arc torch power supply assemblies having a reduced weight as compared to conventional systems that produce a similar or equivalent amount of power. For example, an example estimated weight savings for an 85 Amp plasma system (e.g., the PMX85 system from Hypertherm, Inc.) is shown below.

Whereas, a WBG85 design (e.g., a 85 Amp system made using wide bandgap semiconductor materials) is expected to switch at an approximate switching frequency of 60-72 khz when made with components made from SiC.

Estimated weight reduction (using a switching frequency of 64 khz) is SQR(27/64)=0.65. Therefore, the estimated WBG85 unit is expected to weigh about 0.65*30.3=19.7 kg, which provides an estimated power-to-weight ratio of about 20,400 W/19.7 Kg=1,035 W/kg.

In some embodiments, the power-to-weight ratio includes a ratio of a level of power generated by the power supply to a combined weight of the housing, all components contained within the housing, a plasma torch lead line connected to the housing, and a plasma torch connected to the torch lead line. In some embodiments, the power-to-weight ratio includes a ratio of a level of power generated by the power supply to a combined weight of the housing and the power supply. In some embodiments, the power-to-weight ratio includes a ratio of a level of power generated by the power supply to a weight of the power supply itself.

In some embodiments, the power-to-weight ratio is at least 800 Watts per kilogram (W/kg). In some cases, the power-to-weight ratio can be at least 1000 W/kg (e.g., at least 1200 W/kg).

Table 4 shows a comparison of the potential gains (e.g., in terms of inverter frequency, weight and efficiency) that can be achieved by an 85 A plasma arc torch system with a power supply assembly constructed from only electronic components formed with silicon semiconductor materials, a mix of silicon electronic components and components formed of wide bandgap semiconductor materials, and only electronic components formed with wide bandgap semiconductor materials.

TABLE 4

Potential Gains on an 85 A System (Power Supply Only)

| Semiconductor Materials | inverter Freq | Weight (lbs) | efficiency |
|---|---|---|---|
| Silicon | 27 khz | 60 | 89-90% |
| Silicon and WBG | 72 khz | 39 | 91-92% |
| WBG | 100-200 khz | 29 | 92-94% |
| | (4 to 7 Fold Increase) | (50% Weight Reduction) | (4% Increase in Efficiency) |

In some embodiments, power supply architecture can be adjusted to capitalize on the gains provided by wide bandgap materials, such as reducing or eliminating certain components that are otherwise needed for silicon-based devices (e.g., magnetic components, heat sinks, etc.). Table 5 shows a potential improvement in the size of an 85 A plasma arc processing system if a hybrid of electronic components made from wide bandgap semiconductor material and electronic components made from conventional silicon semiconductor materials are used. As shown, there is a reduction of about 41% in volume in comparison to today's silicon-based 85 A plasma arc processing system.

In addition to the potential weight savings resulting from the use of wide bandgap semiconductor materials discussed above, the systems and methods described herein, in some embodiments, can also provide plasma arc torch power supply assemblies having a reduced size (e.g., volume) as compared to conventional systems that produce a similar or equivalent amount of power. For example, an estimated volume savings for an 85 Amp plasma system (e.g., the PMX85 system from Hypertherm, Inc.) is calculated below.

The current PMX85 (finv=27 khz) has a volume that is about 19.7 in.×9.2 in.×17.9 in.=3244 in$^3$ (with-out handles) with ARC Stretch Power of 85a*240v=20.4 kw. Therefore, the PMX85 has a power-to-volume ratio that is approximately 20,400 W/2882 in$^3$=7.1 W/in$^3$.

Whereas, a WBG85 design (e.g., the 85 Amp system made using wide bandgap semiconductor materials) is expected to switch at approximately a switching frequency 60-72 khz with components made from SiC.

Estimated size reduction (using a switching frequency of 64 khz) is SRQ(27/64)=0.65. Therefore, the estimated WBG85 unit is expected to be about 0.65*3244=2109 in$^3$, which provides an estimated power-to-volume ratio of about 20,400 W/2109 in$^3$=10.7 W/in$^3$.

In some embodiments, the power-to-size (e.g., volume) ratio includes a ratio of a level of power generated by the power supply to a combined volume occupied by the housing (e.g., including the housing and all components contained within the housing) and the volume of the plasma torch lead line connected to the housing, and a plasma torch connected to the torch lead line. In some embodiments, the power-to-size ratio includes a ratio of a level of power generated by the power supply to a volume enclosed by the housing. In some embodiments, the power-to-size ratio includes a ratio of a level of power generated by the power supply to a volume of the electronic components themselves (e.g., the components formed of wide bandgap semiconductor materials).

In some embodiments, the power-to-volume ratio is at least 9 Watts per cubic inch (W/in$^3$). In some cases, the power-to-volume ratio can be at least 10 W/in$^3$ (e.g., at least 12 W/in$^3$).

TABLE 5

Potential System Volume Improvements

| Conventional 85 Amp System (PMX 85) | 19.7" × 9.2" × 17.9" = 3,244 in$^3$ | 30.3 kg |
|---|---|---|
| WBG/Si Hybrid 85 Amp System | 17" × 8" × 14" = 1,904 In$^3$ 41% Reduction in Volume | 30.3 kg × 0.65 = 19.7 kg |
| Conventional 105 Amp System | 23.3" × 10.8" × 20" = 5,032 in$^3$ | 45 kg |
| WBG/Si Hybrid 105 Amp System | 5,032" × 0.65 = 3,271 In$^3$ 35% Reduction in Volume | 45 kg × 0.65 = 29.3 kg |
| Conventional 125 Amp System (PMX 125) | 23.3" × 10.8" × 20" = 5,032 in$^3$ | 49 kg |
| WBG/Si Hybrid 125 Amp System | 5,032" × 0.65 = 3,271 In$^3$ 35% Reduction in Volume | 49 kg × 0.65 = 31.9 kg |

In addition or alternatively to the wide bandgap materials described herein, plasma arc torch power supply systems can include circuits that have additional semiconductor devices that help to make the circuit smaller and more compact, which can make the system more efficient or easier to use. For example, plasma arc torch ignition circuits can include one or more switching devices, such as solid state switching devices, which can help reduce the number of other components or the size of other components used within the ignition circuit. Such ignition circuits can be particularly useful with mechanized plasma torch systems.

Figure 4:
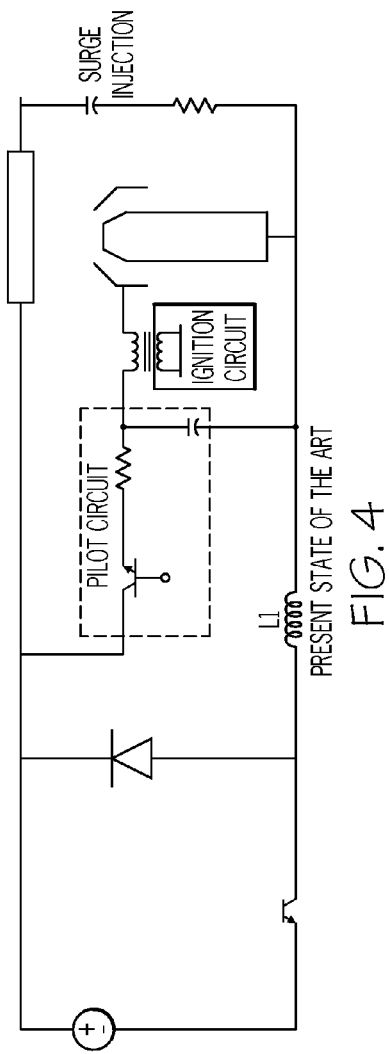
FIG. 4 is an example schematic diagram of a conventional plasma torch power supply with an example conventional plasma torch ignition circuit.
Figure 5A:
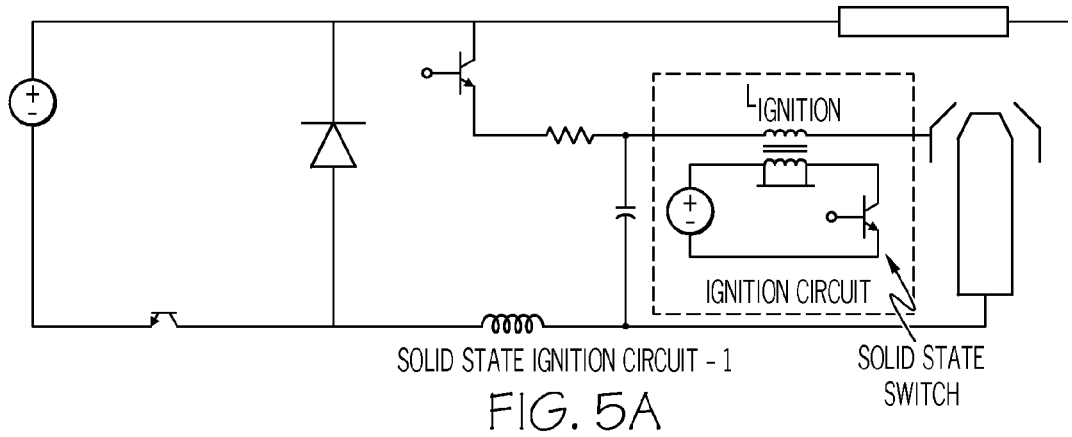
FIGS. 5A-5F are example schematic diagrams of plasma torch power supplies having plasma torch ignition circuits with switching devices.
Figure 5B:
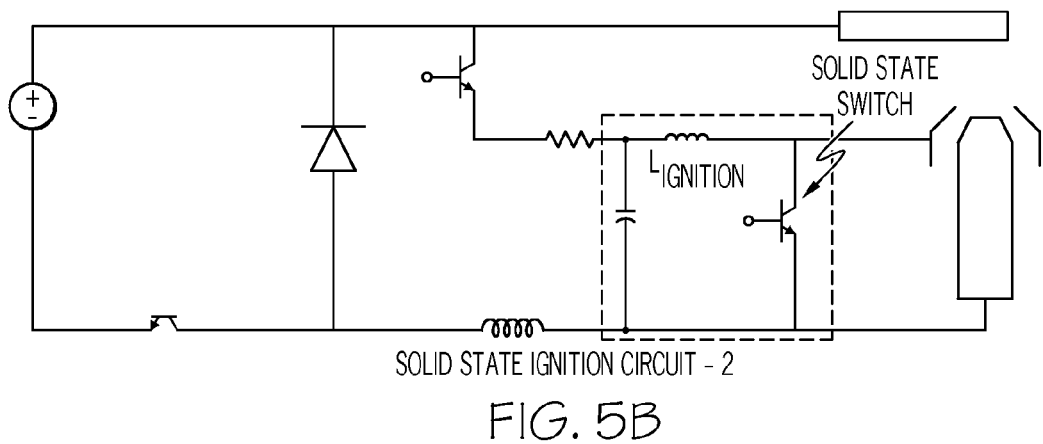
Figure 5C:
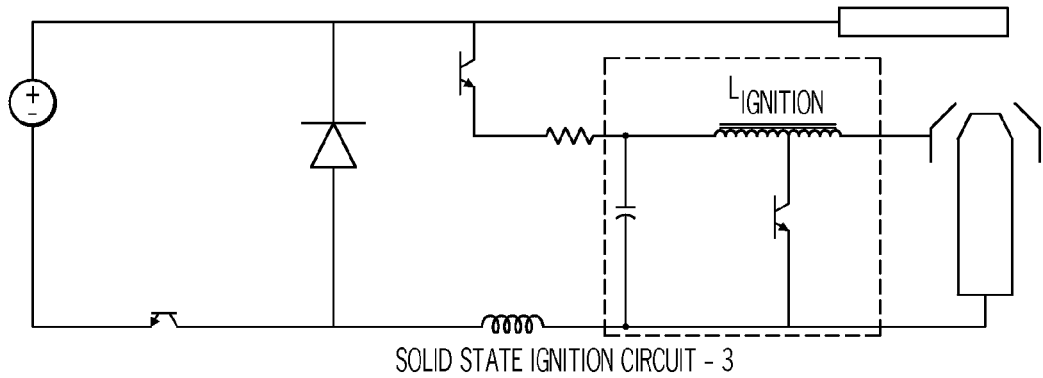
Figure 5D:
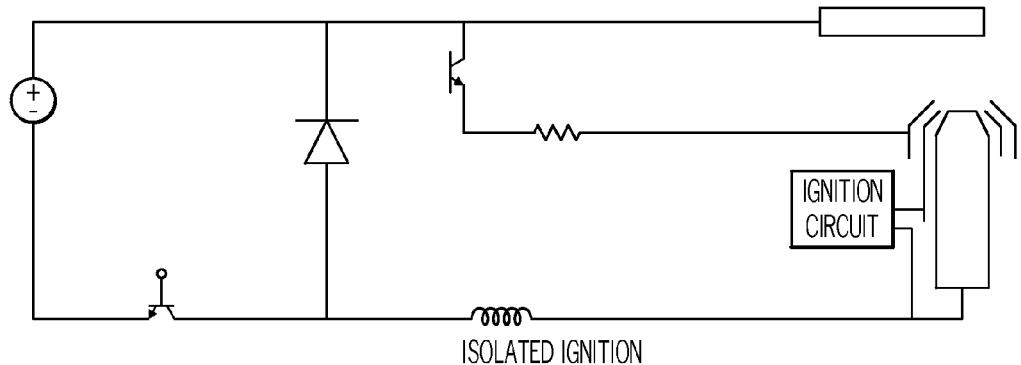
Figure 5E:
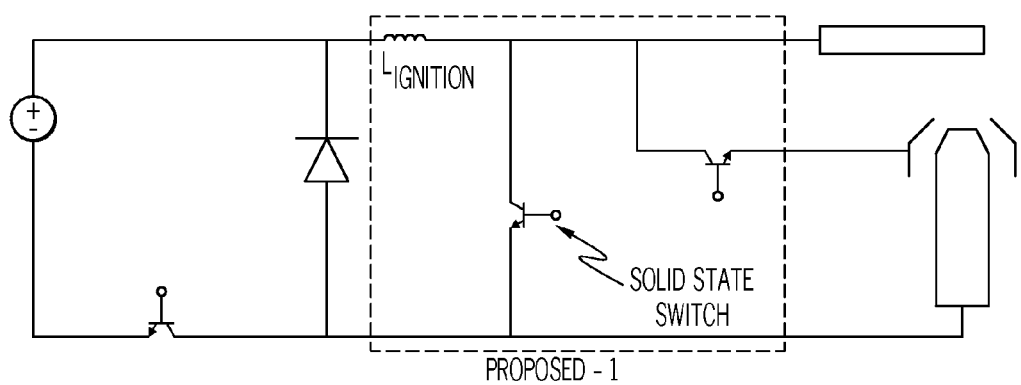
Figure 5F:
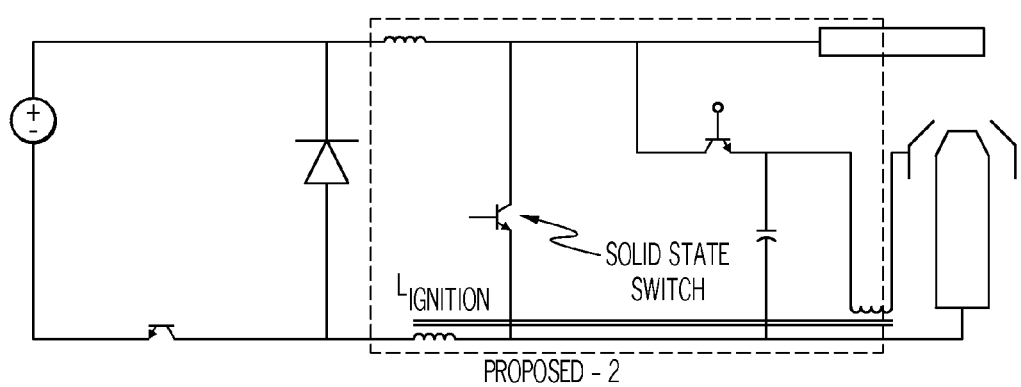

For example, FIG. 4 illustrates an example conventional plasma torch circuit with an ignition circuit formed of spark gaps and one or more passive components (e.g., inductors). An example inductor used in this type of circuit can be an air core Tesla coil transformer with primary to secondary winding turns ratio of 3.5:9 and volume 785 cm$^3$.

FIGS. 5A-5F illustrate example plasma torch power supply circuits having a plasma torch ignition circuit including a switching device, such as a solid state switching device. The switching device can be used to reduce or eliminate spark gaps and large passive components (e.g., an air core transformer, a 6 kV line frequency step-up transformer, and a tuning capacitor) used in conventional circuits. For example, by adding a switching device (e.g., a solid state switching device) to a plasma torch ignition circuit, the need for a spark gap can be reduced (e.g., eliminated) and smaller passive components, such as inductors or capacitors, can be used. As a result of the reduced size of components used within the ignition circuit, the ignition circuit itself (i.e., an ignition circuit module) can be designed smaller and more compact than conventional ignition circuit systems. In some cases, the more compact ignition circuits of FIGS. 5A-5F can be packaged and disposed in areas of the plasma torch system that may otherwise be unattainable with conventional designs. For example, more compact and portable ignition systems can be disposed in a region closer (e.g., much closer) to the torch, which can help make the system more efficient as energy loss can occur when the ignition circuit is disposed within the power supply and far away from the torch due at least in part to the electrical resistance of the torch lead line that delivers the ignition voltage to the torch.

The solid-state ignition circuits of FIGS. 5A-5F can include a two winding transformer ($L_{ignition}$) and the solid state switching device can be connected to a DC power source $V_{dc}$, typically around 170-200V DC. The solid state switching device can be is operated with a control circuit to store energy in the transformer to a desired value by controlling the current through its primary winding. The switch can be turned off when the primary current reaches a target value. The switch turn-off can produces a high voltage pulse to ionize the gas flowing through the torch due to the transfer of energy stored in the transformer through its secondary winding, thus ionizing the gas for ignition.

In some embodiments, the ignition circuits described herein (e.g., in FIGS. 5A-5F) can be distinguished from other types of ignition circuits due to the high voltage ionization pulse that is produced by turning off the switching device rather than by turning on the switching device.

The solid state switching device can be a single semiconductor device. In some examples, the semiconductor switching device can have a voltage rating of 10-15 kV and a current rating of 100-200 A. In addition, in some embodiments, the switching speed (turn-on and turn-off speed) of the semiconductor switching device is around 100 nanoseconds (ns) or less for efficient ignition voltage pulse generation. In some examples, implementations of this circuit using a conventional silicon semiconductor device (e.g. IGBT) may require series connection of several such switching devices to produce suitable solid-state switches. Alternatively, higher voltage rated IGBTs (e.g., operating at 5 kV and above) could potentially be used, however, switching speeds for conventionally available higher voltage IGBT's are not expected to be suitable.

Figure 6:
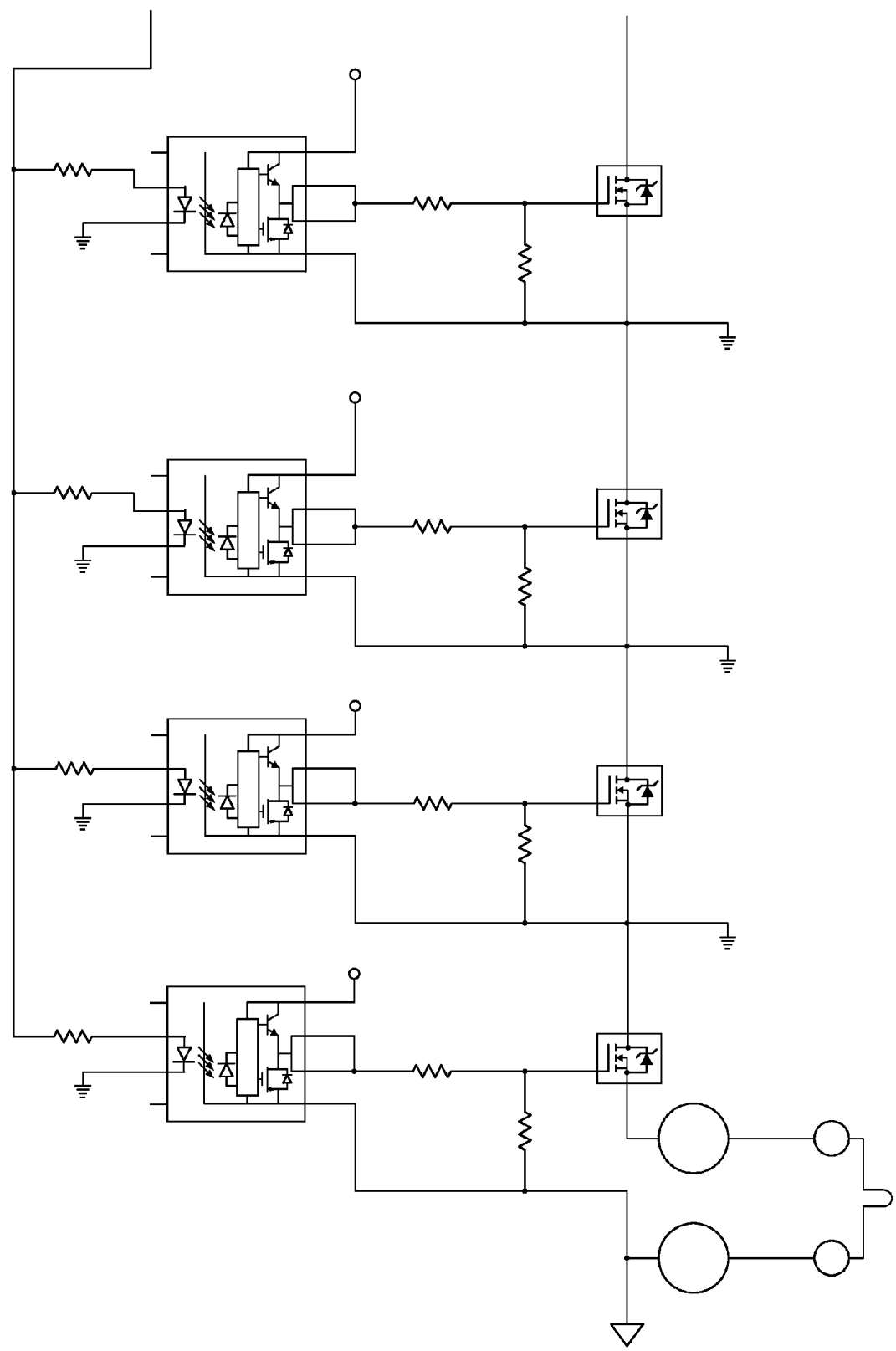
FIG. 6 is an example schematic diagram of an ignition circuit switching device formed of silicon switching devices connected in series.

The series connected approach using silicon IGBT technology has certain considerations. For example, in some cases, the plurality of devices may have reliability or performance issues during usage. Further, switching speeds may vary with devices and operating temperatures, which can yield inconsistent ignition voltage values. In some embodiments, the switching device could include four (4) 1200V (e.g. IRG4PSH71-1200V, 78 A superfast IGBT) devices, as depicted in FIG. 6.

The torch ignition circuits of FIGS. 5A-5F can include any number of various types of other types of solid state switching devices (e.g., MosFETs or IGBTs). For example, the solid state switching devices can include one or more transistor modules having switches formed of one or more of the wide bandgap materials described herein. Such wide bandgap materials could be implemented to help make the switching devices themselves smaller and more compact, which can also help make the entire ignition circuit smaller and more compact. Additionally or alternatively, the switching devices added to the ignition can include one or more conventional insulated-gate bipolar transistor module (IGBT) switches. That is, in some cases, conventional silicon IGBT devices may include additional components (e.g., a secondary winding of the ignition inductor $L_{ignition}$ used for delivering the ignition voltage pulse may need to be larger to compensate for the reduction in primary voltage). This can result in an increase in the size and weight of the overall circuit.

Figure 7:
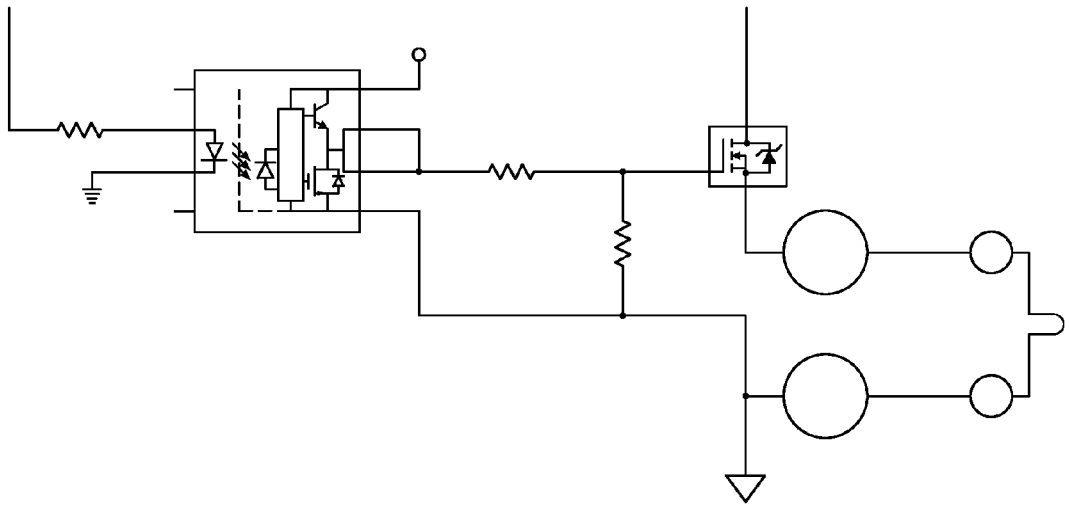
FIG. 7 is an example schematic diagram of an ignition circuit switching device formed of a switching device made of a wide bandgap semiconductor material.

Therefore, in some embodiments, the wide bandgap semiconductors can be implemented to further increase performance of the modified ignition circuits. Specifically, wide band gap semiconductor technology can be used to provide solid-state switches that meet the desired voltage (e.g., 5 kV and above), the desired current (e.g., 50 A and above), and the desired switching speed (e.g., 100 ns or less). For example, FIG. 7 illustrates an example schematic of a single switch formed of wide bandgap semiconductor material (e.g., a 15 kV/20 A SiC switching device). As a result, the inductor size and weight can be reduced to result in a substantially compact, efficient, and reliable ignition circuit, which could potentially be located near the torch. In some embodiments, the single switch configuration can reduce electromagnetic (EM) noise levels and improve user experience.

While certain examples have been discussed, the plasma torch power supply systems described herein can be designed and constructed to be more compact or efficient to use by implementing the ignition circuits described herein alone or in combination with the wide bandgap semiconductor materials described herein.

As one skilled in the art will fully appreciate, the description above with respect to incorporation of wide bandgap semiconductor materials in plasma arc torches is also applicable to other cutting systems that require high power outputs, such as welders and the like. In addition, aspects of the technology are applicable to a wide variety of connected and cordless power driven tools. Furthermore, it should also be understood that various aspects and embodiments of the invention can be combined in various ways. Based on the teachings of this specification, a person of ordinary skill in the art can readily determine how to combine these various embodiments. Modifications may also occur to those skilled in the art upon reading the specification.

While various embodiments have been described herein, it should be understood that they have been presented and described by way of example only, and do not limit the claims presented herewith to any particular configurations or structural components. Thus, the breadth and scope of a preferred embodiment should not be limited by any of the above-described exemplary structures or embodiments, but should be defined only in accordance with the following claims and their equivalents. Therefore, other embodiments fall within the scope of the following claims.

What is claimed:

1. A plasma torch cutting system comprising:
   a housing; and
   a plasma torch power supply within the housing and configured to generate a signal that initiates generation of a plasma arc in a torch head, the power supply including an integrated output circuit configured to receive a signal from an input circuit of the power supply and generate the signal that initiates generation of the plasma arc, the integrated output circuit comprising a plurality of electronic components, at least one of the electronic components of the integrated output circuit being at least partially formed of a wide bandgap semiconductor material,
   a ratio of a level of nominal power generated by the power supply to a combined weight of the housing, the power supply, and any other components contained within or coupled to the housing being at least 800 Watts per kilogram (W/kg).

2. The plasma torch cutting system of claim 1, wherein the ratio of a level of nominal power generated by the power supply to a weight of the power supply contained within the housing is at least 1000 Watts per kilogram (W/kg).

3. The plasma torch cutting system of claim 1, wherein the weight of the power supply contained within the housing is less than 29.3 kilograms.

4. The plasma torch cutting system of claim 1, wherein a ratio of a level of nominal power generated by the power supply to a volume enclosed by the housing is at least 10 Watts per cubic inch (W/in$^3$).

5. The plasma torch cutting system of claim 1, wherein a ratio of a level of nominal power generated by the power supply to a volume occupied by the power supply within the housing is at least 10 Watts per cubic inch (W/in$^3$).

6. The plasma torch cutting system of claim 1, wherein the wide bandgap semiconductor material comprises a material having a bandgap energy level that is greater than about 3 eV.

7. The plasma torch cutting system of claim 1, wherein the wide bandgap semiconductor material comprises at least one of silicon carbide, zinc oxide, gallium nitrate, or diamond.

8. The plasma torch cutting system of claim 1, wherein the at least one of the electronic components of the integrated output circuit being at least partially formed of a wide bandgap semiconductor material are components of a torch ignition circuit of the power supply.

9. The plasma torch cutting system of claim 1, wherein the at least one of the electronic components of the integrated output circuit being at least partially formed of a wide bandgap semiconductor material are configured to operate at a switching frequency of at least 50 kHz.

10. The plasma torch cutting system of claim 9, wherein the at least one of the electronic components of the integrated output circuit being at least partially formed of a wide bandgap semiconductor material is configured to operate at the switching frequency of at least 50 kHz at at least 1200 volts.

11. The plasma torch cutting system of claim 1, wherein the at least one of the electronic components of the integrated output circuit being at least partially formed of a wide bandgap semiconductor material are configured to operate at a switching frequency of at least 100 kHz.

12. The plasma torch cutting system of claim 1, wherein the integrated output circuit comprises at least one of a torch ignition circuit or a torch control circuit.

13. The plasma torch cutting system of claim 1, wherein the at least one of the electronic components of the integrated output circuit being at least partially formed of the wide bandgap semiconductor material comprises at least 25% of active electronic components used within the plasma torch cutting system being at least partially formed of the wide bandgap semiconductor material.

14. The plasma torch cutting system of claim 1, wherein the at least one of the electronic components of the integrated output circuit being at least partially formed of the wide bandgap semiconductor material comprises at least 50% of active electronic components used within the plasma torch cutting system being at least partially formed of the wide bandgap semiconductor material.

15. The plasma torch cutting system of claim 1, wherein the at least one of the electronic components of the integrated output circuit being at least partially formed of the wide bandgap semiconductor material comprises at least one of a power supply input bridge, a power supply power factor correction diode, an inverter, a power supply output diode, or a PA insulated gate bipolar transistor.

16. The plasma torch cutting system of claim 1, wherein the at least one of the electronic components of the integrated output circuit being at least partially formed of the wide bandgap semiconductor material comprises a power supply power factor correction diode that is a first silicon carbide MOSFET and an inverter that is a second silicon carbide MOSFET.

17. The plasma torch cutting system of claim 1, further comprising a plasma torch electrically connected to the power source to produce the plasma arc.

18. A plasma arc processing system comprising:
an enclosure body; and
a plasma arc processing device power supply disposed within the enclosure body and adapted to generate a start signal that initiates generation of a plasma arc in a plasma arc processing device, the power supply including an integrated output circuit configured to receive a signal from an input circuit of the power supply and generate the signal that initiates generation of the plasma arc, the integrated output circuit comprising a plurality of electronic processing components, one or more of the electronic processing components of the integrated output circuit at least partially comprising a semiconductor material having a bandgap energy level that is greater than about 3 eV,
a ratio of a level of nominal power generated by the power supply to a combined weight of the housing, the power supply, and any other components contained within or coupled to the housing being at least 800 Watts per kilogram (W/kg).

19. The plasma arc processing system of claim 18, wherein a ratio of a level of nominal power generated by the power supply to a volume occupied by the power supply within the enclosure body is at least 10 Watts per cubic inch (W/in$^3$).

20. The plasma arc processing system of claim 18, wherein the semiconductor material having a bandgap energy level that is greater than about 3 eV includes a wide bandgap material.

21. The plasma arc processing system of claim 18, wherein the semiconductor material having a bandgap energy level that is greater than about 3 eV comprises at least one of silicon carbide, zinc oxide, gallium nitrate, or diamond.

22. The plasma arc processing system of claim 18, wherein the one or more of the electronic processing components at least partially comprising the semiconductor material having a bandgap energy level that is greater than about 3 eV are components of a torch ignition circuit of the power supply.

23. The plasma arc processing system of claim 18, wherein the one or more of the electronic processing components at least partially comprising the semiconductor material having a bandgap energy level that is greater than about 3 eV are configured to operate at a switching frequency of at least 50 kHz.

24. The plasma arc processing system of claim 23, wherein the one or more of the electronic processing components at least partially comprising the semiconductor material having a bandgap energy level that is greater than about 3 eV are configured to operate at the switching frequency of at least 50 kHz at at least 1200 volts.

25. The plasma arc processing system of claim 18, wherein the integrated output circuit comprises a torch ignition circuit.

26. The plasma arc processing system of claim 18, wherein at least 50% of active electronic components used within the plasma torch cutting system are at least partially formed of the semiconductor material having a bandgap energy level that is greater than about 3 eV.

27. The plasma arc processing system of claim 18, wherein the one or more of the electronic processing components at least partially comprising the semiconductor material having a bandgap energy level that is greater than about 3 eV comprises at least one of a power supply input bridge, a power supply power factor correction diode, an inverter, a power supply output diode, or a pilot arc insulated gate bipolar transistor.

28. The plasma arc processing system of claim 18, further comprising a plasma torch electrically connected to the power source to produce the plasma arc.

29. A plasma torch cutting system comprising:
   a housing;
   a plasma arc torch; and
   a power supply within the housing and electrically connected to the plasma arc torch, the power supply configured to generate an electric signal that initiates generation of a plasma arc in the plasma arc torch, the power supply including:
      an input circuit having at least one of i) a rectification circuit and ii) a power factor corrected boost converter circuit; and
      an output circuit having at least one of i) an inverter circuit and ii) one or more output diodes and being configured to receive a signal from the input circuit and initiate generation of the plasma arc,
   wherein the input circuit and the output circuit are formed of a plurality of active electronic components used to generate the electric signal, and at least 25% of the active electronic components are formed, at least in part, of a wide bandgap semiconductor material; and
   a ratio of a level of nominal power generated by the power supply to a combined weight of the housing, the power supply, and any other components contained within or coupled to the housing is at least 800 Watts per kilogram (W/kg).

30. The plasma torch cutting system of claim 29, wherein the wide bandgap semiconductor material comprises a material having a bandgap energy level that is greater than about 3 eV.

31. The plasma torch cutting system of claim 29, wherein the wide bandgap semiconductor material comprises silicon carbide.

32. The plasma torch cutting system of claim 29, wherein at least 50% of the active electronic components are formed at least in part of a wide bandgap semiconductor material.

33. The plasma torch cutting system of claim 29, wherein the at least 25% of the active electronic components are formed, at least in part, of a plurality of wide bandgap semiconductor materials.

34. A method of manufacturing a plasma torch cutting system, the method comprising:
   providing a plasma torch power supply disposed within a power supply housing and configured to generate a signal that initiates generation of a plasma arc in a torch head, the power supply including an integrated output circuit configured to receive a signal from an input circuit of the power supply and generate the signal that initiates generation of the plasma arc, the integrated output circuit comprising a plurality of electronic components, at least one of the electronic components of the integrated output circuit being at least partially formed of a wide bandgap semiconductor material, a ratio of a level of nominal power generated by the power supply to a combined weight of the power supply housing, the power supply, and any other components contained within or coupled to the power supply housing is at least 800 Watts per kilogram (W/kg);
   disposing the plasma torch power supply within the power supply housing and securing the plasma torch power supply to the power supply housing; and
   providing one or more gas flow connections within the power supply housing configured to be to connected to a plasma torch lead line to provide gas flow to the torch head.

* * * * *